United States Patent [19]

Kano

[11] 3,853,398

[45] Dec. 10, 1974

[54] MASK PATTERN PRINTING DEVICE

[75] Inventor: Ichrio Kano, Yokohama, Japan

[73] Assignee: Canon Kabushiki Kaisha, Tokyo, Japan

[22] Filed: June 4, 1973

[21] Appl. No.: 366,576

[30] Foreign Application Priority Data

July 5, 1972 Japan ................................ 47-67399
July 5, 1972 Japan ................................ 47-67401

[52] U.S. Cl. ....................................... 355/43, 355/45
[51] Int. Cl. ............................................. G03b 27/70
[58] Field of Search ............................ 355/43, 44, 45

[56] References Cited

UNITED STATES PATENTS

| | | | |
|---|---|---|---|
| 3,542,469 | 11/1970 | Hennings | 355/43 UX |
| 3,698,808 | 10/1972 | Delmas | 355/45 |
| 3,718,396 | 2/1973 | Hennings | 355/43 |
| 3,733,125 | 5/1973 | Dewaele | 355/45 X |

*Primary Examiner*—Richard A. Wintercorn
*Attorney, Agent, or Firm*—Toren, McGeady and Stanger

[57] ABSTRACT

In the mask pattern printing device disclosed an optical system forms an illuminating beam and directs the illuminating beam through a mask onto a photosensitive surface and thereby forms a reflected beam. An observation system for aligning the mask image with the photosensitive surface is composed of a polarizer, a delay for delaying the polarized light one-quarter wavelength, and an analyzer. The observation system locates the polarizer in the illuminating beam before it reaches the mask to polarize the beam passing through the mask and the delay between the mask and the surface while the analyzer protrudes into the reflected beam for observation. Preferably the observation system is capable of moving at least the analyzer and the polarizer into and out of the illuminating beam. The observation system eliminates harmful reflected light from the mask and observes only the reflected light from the photosensitive plate.

11 Claims, 3 Drawing Figures

MASK PATTERN PRINTING DEVICE

The present invention relates to a mask pattern printing device which is used in production of integrated circuits and is applicable in cases when a photo-mask and a wafer are aligned to each other and are printed, etc.

In producing integrated circuits, it is necessary to have various kinds of originals that is masks overlappedly printed over a same wafer. In this case the pattern already printed on a wafer and the pattern of a mask which is to be printed subsequently must have such a positional relationship that they are fixed to each other. For that end, the mask and the wafer must be simultaneously observed before printing and the mask or the wafer must be moved to effect such delicate adjustment as placing them in a predetermined positional relationship. This process is called as alignment. On the other hand as a method to print the mask on the wafer, conventionally a contact printing method has been used, but recently a projection printing method by lens has been utilized because of such advantages that the mask and the wafer are not scratched. The present invention is to provide a mask pattern printing device applied to the alignment of the projected image of the mask and the wafer in such projection printing method.

Generally speaking in a printing device Koehler illumination method (an illumination system so arranged that the image of light source is made at an entrance pupil of an objective lens) is employed for printing for obtaining uniform intensity of illumination for entire surface of the photo-mask. Also in order to obtain clear photo-resist image, the numerical aperture (the numerical aperture is expressed by $n \sin a$ when an object point on an optical axis within a medium having a refractive index $n$ makes an angle $\alpha$ against the radius of the entrance pupil) of an illuminating optical system is made small compared to that of a projection lens making such state as close to so-called coherent illumination, thus the contrast of the projected image is enhanced. However, at the time of observation when such illumination method is used as it is, a phase image appears because of unevenness in the thickness of a coated layer of photo-resist coated on the wafer, therefore the marginal periphery of the wafer image becomes obscure.

For eliminating such shortcomings, it is necessary to make the numerical aperture of the illumination optical system at the time of observation sufficiently large to provide an illumination condition of such state as close to so-called incoherent illumination. The simplest method for achieving the same is to insert a diffusion plate in an illumination optical system. However, this method has such shortcomings that loss of light amount is resulted from said diffusion plate making the image dark. Also as the observation point moves, in order to move an alignment scope so that luminous flux is always concentrated to the observations point, heretofore either an observation light source is attached to an alignment scope, or the luminous flux must be guided to an alignment scope using a light guide from a printing light source, thus accessories are necessary.

Also in a device in which observation luminous flux is projected out of the rear plane of the mask and the mask pattern is observed from the rear plane of the mask, reflective light by the mask base plate glass may sometimes impair the contrast of an observation image. Particularly in a projection printing device when the transmittivity of projection lens is poor the luminosity of the wafer image becomes insufficient and the reflective light from the mask base plate glass becomes harmful. While the harmful reflective light can be eliminated depositing by evaporation a reflection preventive film on the mask base plate glass, it is not desirable as the mask production process steps increase.

The present invention intends to eliminate such conventional shortcomings, and is applied to such projection image observation device that a reflective photosensitive plate is placed at mutually conjugate position with the mask at the exit side of such imaging lens as having exit pupil at an infinity position or at an almost infinity position, and an illumination optical system is positioned at the mask side of the above mentioned imaging lens, further a beam splitter and an alignment optical system are provided at the time of observation between said mask and the illuminating optical system. The object of the present invention is as follows:

1. To provide a projection image observation device which provides bright images and allows good observation of wafer image by inserting an optical system between the above mentioned beam splitter and the illumination optical system to increase the numerical aperture of the illumination optical system at the time of observation greater than that at the time of printing.
2. To provide a projection image observation device in which luminous flux is always concentrated at an observation point following the movement of the observation point, by providing an optical means which is at least linked with the movement of an objective lens within the above mentioned alignment optical system between the above mentioned beam splitter and the illumination optical system.
3. To provide a projection image observation device, which is a mask pattern observation device, wherein luminous flux for observation is projected from the rear plane of the above mentioned mask and the mask pattern is observed from the rear plane of the mask, having a means to polarize the luminous flux from the above mentioned illuminating optical system, further having a means to change the polarization state of the above mentioned polarized luminous flux having its wavelength substantially delayed by a quarter wavelength in an optical path between the above mentioned mask and the reflective photo-sensitive plate, still further having an analyzer means in the mask pattern observation optical path, so that the harmful reflective beams for the mask base plate are eliminated and only the reflective beams by the reflective sensitization are observed.
4. To provide a projection image observation device according to the paragraph (3) above, in which a means is provided to rotate the above mentioned analyzer means within a plane perpendicular against an optical axis to make the contrast of the mask pattern variable
5. To provide a projection image observation device in which a tube shape member having a reflective inner wall having its incident side end plane accord with the secondary light source plane by the above mentioned illumination optical system is provided, so that unevenness of the intensity of illumination with the observation field of view by the illumination light source is eliminated by making the exit side end plane of said member a new secondary light source.

Now, one pattern of embodiment of the device according to the present invention shall be explained in detail referring to the drawings.

Figure 1:
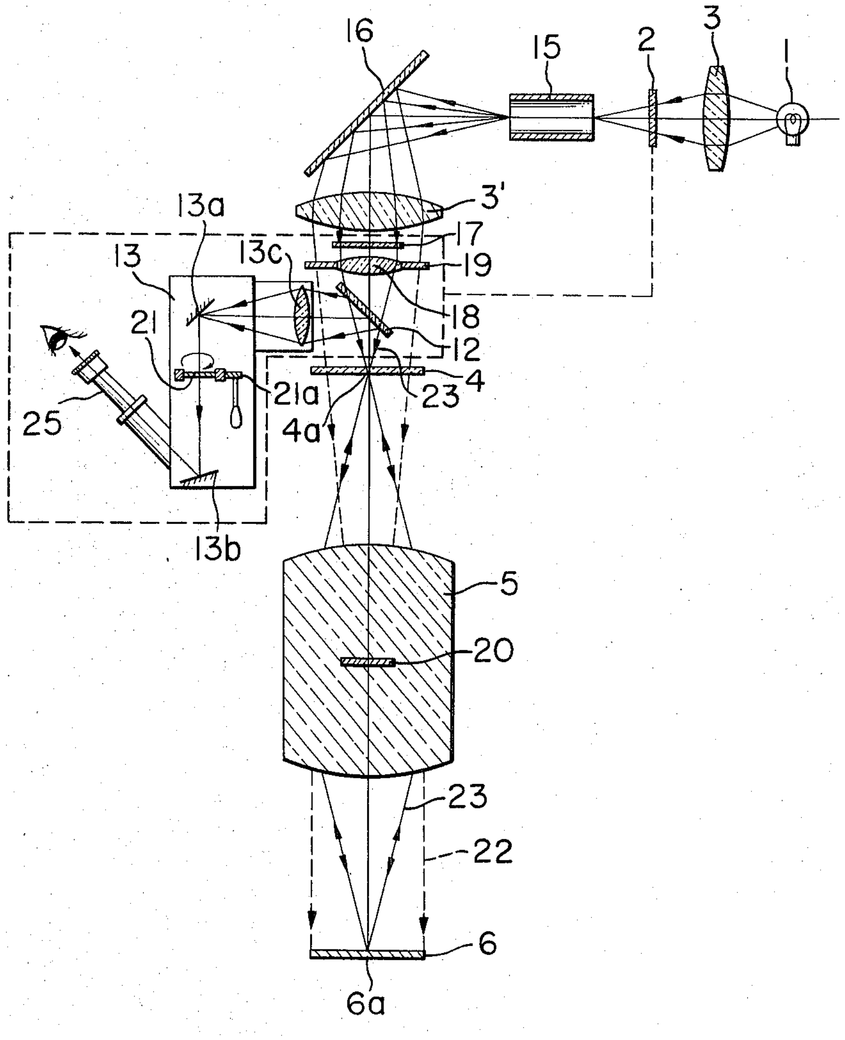
FIG. 1 is a schematic drawing of one embodiment pattern of the mask pattern printing device according to the present invention.

The drawings show a schematic drawing of one embodiment of the projection image observation device according to the present invention, showing the state at the time of observation of the projected image, wherein such means as optical systems, etc. shown within the broken line is removed out of a printing optical path at the time of printing as will be described below. In the drawings, 1 is a light source which serves both for printing and for observation, wherein luminous flux generated out of this light source is condensed at the incident end plane of a light pipe 15 by a first condensor lens 3. This light pipe 15 is a tubular member having a reflective inner wall, wherein the luminous flux entering into the light pipe 15 is totally reflected repeatedly, thus when the flux comes out of its exit end plane, a secondary light source within uniform brightness is formed even if the brightness of the illumination light source 1 is not uniform.

The luminous flux coming out of this secondary light source has its optical path bent by 90° by an optical path changing mirror 16 placed with a slant of 45° against the optical axis. 3′ is a second condensor lens and condenses the luminous flux from said optical path changing mirror 16. 4 is a mask having a desired pattern, and 5 is an imaging lens and has an imaging characteristics and at the same time its image side (wafer side) is made to be so-called telecentric, that is its exit pupil is at an infinity. 6 is a photo-sensitive plate of reflective nature such as wafer, etc. placed at an exit side of the above mentioned imaging lens 5 and at such position as conjugate with the mask 4.

When projection printing of the pattern on the mask 4 is done on a reflective photo-sensitive plate 6 such as wafer, etc., after such alignment process is done as will be explained below, the mask 4 is uniformly illuminated by the projection from the light source 1, and at the same time the luminous flux penetrating through the imaging lens 5 passes through a printing optical path 22 and is projected on the reflective photo-sensitive plate by so-called Koehler illumination method by which the flux is condensed at the incident pupil of the imaging lens 5.

Next, explanations shall be made on a means required at the time of observation of the projected image in addition to the means required at the time of printing as mentioned above. 2 is a filter for observation inserted at any desired position in an optical path of the light source 1 and the mask 4, preferably between the first condensor lens 3 and the light pipe 15, and works as a filter for preventing exposure of the reflective photo-sensitive plate 6 at the time of observation, and may also serve as a shutter for printing light. 17 is a polarizer positioned behind the second condensor lens 3′ and the beam penetrating the same becomes linearly polarized beam. 18 is a condensor lens inserted in a projection optical path at the time of observation, and condenses the beam from the polarizer at an observation point on the mask 4. Such illumination forms so-called critical illumination (illumination system to form an image of the light source at an object plane), and the numerical aperture of the observation illumination optical system increases and at the same time the intensity of illumination at the observation point goes up. 12 is a beam splitter inserted between said condensor lens 18 and the mask 4 and is to guide a portion of the illuminating luminous flux to an alignment scope 13. This alignment scope 13 has an objective lens **13*c*, two totally reflective mirrors 13*a*, 13*b* and an analyzer 21 inserted between said mirrors or at the alignment optical path. This analyzer is made to be freely rotatable by a means 21*a*** to rotate the same within a vertical plane against the alignment optical axis.

25 is an ocular part to observe the state of alignment between the observation point on the photo-mask 4 and the observation point on the reflective photo-sensitive plate. This alignment scope is so made as can be shifted thus it can be so adjusted that any observation point on the photo-mask can be seen. And since the above mentioned condensor lens 18 is provided in such a manner that it is linked with the shifting of the alignment scope, at least with the shifting of the objective lens **13*c* within the alignment optical system, when the alignment scope is shifted for adjustment to move the observation point on the mask 4, the lens 18 is also shifted in a linked movement, thus the luminous flux is always concentrated to the observation point. 19 is a douser to shield the unnecessary luminous flux. An alignment means is composed by the above mentioned members 2, 12, 13, 17, 18, 19, 21 and 25** and they are provided in such a manner that they are evacuated from a projection optical path at the time of printing as shown by broken line in the drawing.

20 is a quarter wave length plate positioned in the optical path between the mask 4 and a reflective type photo-sensitive plate to have the polarized luminous flux being incident on said plate virtually delayed for the quarter wave length thus changing the polarization state, and it may be inserted at the time of observation only, or it may be left inserted at the time of printing also.

The function of the device according to the present invention having the above mentioned arrangement shall be explained next.

The luminous flux generated by the light source 1 is condensed at the incident side end plane of a light pipe 15 through the observation filter 2 by the first condensor lens 3.

This incident luminous flux is totally reflected repeatedly in an inner wall of the pipe 15 and a secondary light source with uniform brightness is formed when coming out of the exit side end plane. The luminous flux coming out of this secondary light source has its optical path bent 90° by an optical path changing mirror 16 and is condensed by the second condensor lens 3′ and penetrates through a polarizer 17, thereby is linearly polarized. The luminous flux after being linearly polarized is further condensed by the condensor lens 18 and is concentrated into the observation point 4a on the mask 4 (refer to the arrow mark 23).

Next, said luminous flux is condensed at the observation point 6a on the reflective photo-sensitive plate 6 by an imaging lens having the above mentioned characteristics (refer to the arrow mark 23). At this time it has its linear polarization changed to circular polarization by penetrating through the quarter wave length plate 20 being positioned between the mask 4 and the reflective photo-sensitive plate 6. While the circular polarized luminous flux being reflected at the reflective photo-sensitive plate 6 is condensed at an observation point on the mask 4 by penetrating through the imaging lens 5 again, as it passes through the quarter wavelength plate 20 again in this process the circular polarized luminous flux is changed to such linearly polarized luminous flux as having a plane of polarization which is perpendicular to the plane of polarization of the linear polarization before passing through said quarter wave length plate 20 for the first time. This luminous flux becomes illuminating luminous flux which illuminates the mask 4 from the rear plane and is further lead to the alignment scope 13 by the beam splitter 12, then after passing through an analyzer 21 which is provided in the alignment optical path in a rotatable manner, is led to an ocular part 25. Said analyzer is so positioned that its plane of polarization perpendicularly crosses with that of the analyzer 17 at a basic rotation position, and the luminous flux thus reaching as reflected by the reflective photo-sensitive plate 6, by being so arranged as above, passes through said analyzer, and such luminous flux as being directly reflected from the surface of the mask 4 only by linearly polarized by the polarizer 17 then coming into the alignment scope of the beam splitter 12 is completely shielded by said analyzer.

Therefore such harmful light as being reflected at the mask base plate 4 and lowering the contrast of an observation image is shielded so that such image that alignment can be easily made therefore can be obtained.

Further in this case when the mask is metal mask such as chromium mask, such mask illuminating light as penetrating the analyzer is only the light which penetrates and illuminates the mask while the light which is reflected for illumination is shielded, therefore opaque portion looks dark and transparent portion looks bright as in an emulsion mask, but there is such case depending on the pattern on the reflective photo-sensitive plate which is to be aligned to said mask that alignment can be made easier as the opaque portion looks bright and the transparent looks dark. In this case when the analyzer 21 is slightly rotated from its basic rotating position, as the reflecting power of the metal mask is very high, the contrast of the mask pattern can be reversed (that is the opaque portion is made bright and the transparent portion dark) with almost no increasing of the harmful light from the glass base plate.

What has been explained above shows the case when the linearly polarized plate is used as a polarizer, an analyzer, but even when the circular polarized plate is used as a poralizer, an analyzer, harmful reflective light can be removed and only the reflective light from the reflective photo-sensitive plate can be observed, thus the polarizer, the analyzer are not limited to the linearly polarized plate.

When the one which emits polarized light such as laser beam is used as a light source a polarizer is not necessary. Said principle is not only used in a projected image observation device, it is also effective as it is applied to an observation device which does not employ a projection lens.

Figure 2:
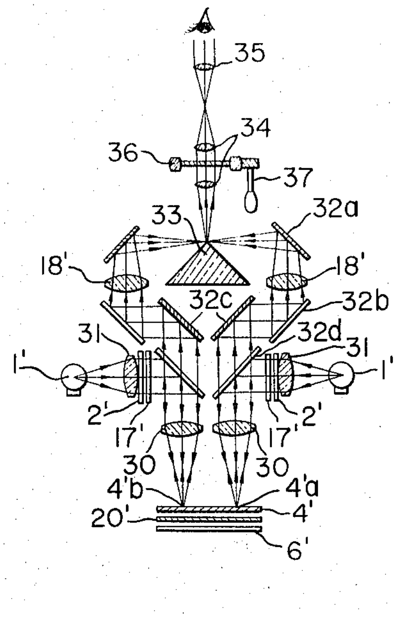
FIG. 2 is a schematic drawing of another embodiment pattern of the mask pattern printing device according to the present invention.
Figure 3:
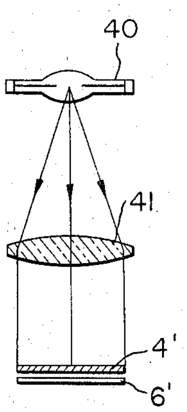
FIG. 3 shows a schematic drawing to show the state of the device shown in FIG. 2 at the time of printing.

FIG. 2 and FIG. 3 show such embodiment pattern as mentioned above wherein a projection lens is not used and the mask and the photo-sensitive plate 2 is contacted together or is positioned with a slight gap, especially FIG. 2 shows the state at the time of observation, and FIG. 3 shows the state at the time of printing.

While the arrangement in this case can be so made as described above except that no projection lens intervenes between the mask 4′ and the reflective photo-sensitive plate 6′, an example of a mask pattern printing device by two point observation method shall be explained referring to FIG. 2.

In the drawing, 6′ is a reflective photo-sensitive plate, 4′ is a mask having a pattern, and 20′ is a quarter wave length plate which virtually delays the polarized luminous flux by quarter wave length being positioned between the mask 4′ and the photo-sensitive plate 6′.

While this quarter wave length plate may be located at the time of printing as explained above, in that case required gap is provided between the mask and the photo-sensitive plate.

30 is an objective lens for an observation microscope, 1′ is an observation light source, 31 is an observation condensor lens, 17 is a polariser, 2′ is an observation filter, 32a, b, c are optical path changing mirrors, 32a is a semi-transparent mirror, and 18′ is a condensor lens, and one each of these members is provided for conducting two points observation. When the luminous flux from a projection source is a polarized luminous flux the polariser 17′ is not necessary. 33 is a field dividing prism, and 34 are elector lenses and one pair of the same is provided with an analyzer 36 intervened therebetween.

The luminous flux emitted by the light source 1′ is made to an almost parallel luminous flux by the condensor lens 31, and the polarized luminous flux has its optical path changed 90° by the semi-transparent mirror 32d through the observation filter 2′, the polarizer 17′, and is condensed onto the observation points 4′a, 4′b on the mask by the objective lens 30 of the observation microscope. The luminous flux which has penetrated through the mask 4′ will be changed from linearly polarized light to circular polarized light, or from circular polarized light to linearly polarized light through the quarter wave length plate 20′. This luminous flux is then reflected at the reflective photo-sensitive plate 6′ and passes through the quarter wave length plate 20′ again, therefore for example the circular polarized luminous flux is changed to linearly polarized luminous flux which has such plane of polarization as vertically crossing with the plane of polarization of the linearly polarized light which is first incident on said wave length plate 20′. This luminous flux becomes such illuminating luminous flux which illuminates the mask 4′ from rear plane, and this luminous flux becomes parallel luminous flux by the lens 30 and is condensed by passing through the condensor lens 18 through the semi-transparent mirror 32d, the optical path conversion mirror 32c, 32b, and further has its optical path changed by 32a, and both the left and right luminous flux can be observed within a same field of vision by the field dividing prism 7.

This luminous flux is, after being made into parallel luminous flux by the first elector lens, incident on the second elector lens through the analyzer 36 thus two observation points can be observed through the ocular lens 35. This analyzer 36 is so positioned that its plane of polarization vertically crosses with that of the polarizer 17' at the basic rotation position, and by doing so the luminous flux which is reflected by the reflective photo-sensitive plate 6' and reaches there passes through said analyzer, but the luminous flux which is reflected directly from the surface of the mask 4' only after being polarized by the polarizer 17' will be completely shielded by said analyzer. Therefore harmful light which is reflected by the mask base plate 4' and lowers the contrast of an observation image is shielded, thus such image that alignment therefor can be made easily is obtained. One point observation method can be simply realized by simplifying the above mentioned arrangement.

FIG. 3 shows the state at the time of printing, wherein the observation means shown in FIG. 2 is removed from the printing optical path of the mask pattern, and the luminous flux being emitted by the printing light source 40 is projected on the mask 4' and the photo-sensitive plate 6' through the projection optical system 41. In this case while it is desirable to print the mask 4' and the photo-sensitive plate 6' having them contacted together, it is also possible to conduct the printing with them separated by such a slight space as not effecting the printing to avoid impairing the photo-sensitive plate 6' by their contacting to each other.

When a metal mask such as chromium mask is used as the mask in the device shown in FIG. 2, such portion of the mask illumination light as passing through the analyzer is only such as penetrating and illuminating the mask and the light which conducts reflection illumination is shielded, therefore the opaque portion looks dark and the transparent portion looks bright as in an emulsion mask. But depending on the kind of patterns on the reflective photo-sensitive plate to be aligned on the mask, it is easier for alignment when the opaque portion looks dark and the transparent portion looks dark. In this case when the analyzers 21, 21' are slightly rotated from the basic rotating position by rotating means 21*a*, 37, as the reflecting power of the metal mask is very high the contrast of the mask pattern can be reversed (that is the opaque portion looks bright while transparent portion looks dark) with almost no increase in harmful light from the glass base plate.

What has been explained above is an example wherein a linearly polarized plate is used as a polarizer, an analyzer, but even when circular polarized plate is used as a polarizer, an analyzer, the harmful reflective light can be eliminated and the reflective light from the reflective photo-sensitive plate only can be observed, thus the polarizer, the analyzer are not limited to linearly polarized plate. Also when such light beam as emitting polarized light for example laser beam is used as a light source, the polarizer is not necessary.

Next, effect of the device according to the present invention shall be explained.

1. Since the numerical aperture of the illumination system at the time of observation is increased compared to that at the time of printing, the phase image which appears by the lack of uniformity of the thickness of photo-resist coating coated on a wafer decreases and the image of the wafer becomes clear.
2. Critical illumination is made to the observation point and the mask image and the wafer image become bright.
3. Since it has such arrangement that even if the observation point is shifted, the condensor lens within the alignment optical system can be shifted in an association with the objective lens within the alignment optical system, the projection luminous flux is always concentrated at the observation point. Further this can be realized using printing light source only, Also an observation light source which is indispensable in a conventional device and the light guide which leads the luminous flux from the printing light source to the alignment part, etc. will become unnecessary.
4. As the harmful light being directly reflected from the mask is removed the contrast of the mask image and the wafer image is improved.
5. As the analyzer is made freely rotatable, the contrast of the mask pattern can be variable or reversed depending on the pattern of the wafer, thus such image as can be easily aligned can be obtained.
6. While in a conventional projection printing device such discharge lamp as an ultra high voltage mercury lamp etc. is used generally having ordinarily unevenness in brightness at a light emission part, according to the present invention, as a tubular shape member for eliminating brightness unevenness of the light source is provided, the effective light source at the time of printing for an imaging lens can be made such ideal state as close to real round and at the same time the intensity of illumination within the filed of vision at the time of observation can be made uniform.

What is claimed is:

1. A mask pattern printing device for a mask having a prescribed pattern, a photo-sensitive plate on which the pattern of the mask is photographed and printed, optical means for passing an illuminating beam of light along a path through the mask and onto the plate and a reflected beam from the plate, and a mask pattern observation means, being characterized by a means to polarize the illuminating light through the mask at the time of observation, said observation means including means in the optical path between the mask and the photo-sensitive plate to virtually delay the polarization state of the polarized luminous beam by a quarter wavelength, and said observation means including analyzer means in the reflected path, for eliminating the harmful reflected light from the mask and observing the reflected light from the photo-sensitive plate only.

2. The mask pattern printing device in claim 1, in which said analyzer means include rotatable means for making the contrast of the mask pattern variable.

3. The mask pattern printing device in claim 1 in which the optical means includes an imaging lens having an exit pupil at or almost at infinity and the reflective photo-sensitive plate is positioned conjugate with the mask at the exit end of the imaging lens and an illumination optical system in the path before the mask, said observation means including a beam splitter and an alignment optical system between said mask and the illumination optical system and an optical means for condensing characteristics between said beam splitter and said illumination optical system so that the numerical aperture of the illumination optical system at the time of observation is increased to a greater value than that at the time of printing.

4. The mask pattern printing device in claim 1, in which said observation means includes an alignment optical system and a beam splitter to pass the light passing toward the mask and deflect the light reflected back through the mask to the alignment optical system and said polarizing means form part of said observation means and a means to rotate said analyzer means within a plane perpendicular to the reflected beam, thus making the contrast of the mask pattern variable.

5. The mask pattern printing device in claim 1, in which said observation means includes an alignment optical system and a beam splitter to split the light beam to the alignment optical system between said mask and the illuminating means.

6. The mask pattern printing device in claim 1, in which said illuminating means includes a light source and a tubular shaped member having reflective inner walls and an incident end plane coinciding with the light source and an exit end plane, said exit end plane forming a secondary light source so that unevenness of the intensity of illumination of the first light source is eliminated.

7. The mask pattern printing device in claim 1, in which said observation means includes a beam splitter in the path of the reflected light for deflecting light and an alignment optical system in the path of the deflected light, an observation filter between said optical means and the mask, said optical means including an optical system having a shifting objective lens between the above mentioned beam splitter and the illuminating optical means, thus always concentrating the luminous flux to an observation point.

8. A mask pattern printing device for printing the pattern of a mask on a photosensitive surface, including optical means for furnishing an illuminating beam and directing the illuminating beam through the mask onto the surface so as to form a reflected beam, polarizing means for polarizing light, delay means for delaying polarized light one-quarter wavelength, analyzer means for analyzing incident light, and observation means for locating said polarizing means in the illuminating beam before the illuminating beam reaches the mask to polarize the illuminating beam passing through the mask and placing said delay means in the illuminating beam between the mask and the photosensitive surface and for causing said analyzer means to protrude into the reflected beam between the polarizing means and the mask to analyze the reflected light.

9. A device as in claim 8, wherein said observation means movably couples said polarizer means and said analyzer means relative to said optical means so as to allow movement of said polarizing means and said analyzer means into and out of the path of the illuminating beam.

10. A device as in claim 8, wherein said analyzer means includes a half mirror for deflecting the reflected beam transversely and allowing passage of said illuminating beam.

11. A device as in claim 9, wherein said analyzer means includes a half mirror for deflecting the reflected beam transversely and allowing passage of said illuminating beam.

* * * * *